United States Patent
Yang et al.

(10) Patent No.: US 7,839,648 B2
(45) Date of Patent: Nov. 23, 2010

(54) CHASSIS STRUCTURE WITH INTERFACE CARD BRACKET

(75) Inventors: Chun-Ying Yang, Taipei (TW);
Yi-Hsuan Chen, Taipei (TW);
Ming-Hung Shih, Taipei (TW)

(73) Assignee: Inventec Corporation, Taipei (TW)

( * ) Notice: Subject to any disclaimer, the term of this patent is extended or adjusted under 35 U.S.C. 154(b) by 381 days.

(21) Appl. No.: 12/099,282

(22) Filed: Apr. 8, 2008

(65) Prior Publication Data

US 2009/0213559 A1    Aug. 27, 2009

(30) Foreign Application Priority Data

Feb. 22, 2008   (TW) .............................. 97106368 A (51) Int. Cl.
*H05K 5/00* (2006.01)
(52) U.S. Cl. ...................................... 361/752; 361/800
(58) Field of Classification Search ................. 361/752, 361/790, 797, 800–803, 730, 679.1, 686, 361/727, 741, 749, 756, 807, 810; 439/377, 439/374; 312/223.1, 223.2
See application file for complete search history.

(56) References Cited

U.S. PATENT DOCUMENTS

| | | | | |
|---|---|---|---|---|
| 5,612,927 A | * | 3/1997 | Morrison et al. | 361/679.39 |
| 7,233,489 B2 | * | 6/2007 | Toyama et al. | 361/679.31 |

* cited by examiner

*Primary Examiner*—Hung S Bui
(74) *Attorney, Agent, or Firm*—Tim Tingkang Xia; Morris, Manning & Martin, LLP (57) ABSTRACT

A chassis structure with interface card bracket is described, which uses a bracket to assemble an interface card in an accommodation space within a chassis. The bracket includes a carrying member and an operating member that are pivoted to each other, and the interface card is fixed on the carrying member. The chassis includes a guide portion disposed therein. As the bracket moves into the accommodation space, the carrying member and the operating member are pivoted with respect to each other upon being guided by the guide portion to form an appropriate included angle there-between, so as to avoid barriers around the accommodation space, thereby assembling the interface card into the accommodation space successfully.

8 Claims, 14 Drawing Sheets

CHASSIS STRUCTURE WITH INTERFACE CARD BRACKET

CROSS-REFERENCE TO RELATED APPLICATIONS

This non-provisional application claims priority under 35 U.S.C. §119(a) on Patent Application No(s). 097106368 filed in Taiwan, R.O.C. on Feb. 22, 2008, the entire contents of which are hereby incorporated by reference.

BACKGROUND OF THE INVENTION

1. Field of the Invention

The present invention relates to a structure for assembling an interface card of an electronic device, and more particularly to a chassis structure of an electronic device and an interface card bracket thereof.

2. Related Art

Host for servers and industrial computers is required to have powerful logic computation ability and extension ability, so as to finish the assigned computation operations in a short time and to offer various services together with a variety of expansion units disposed therein. Therefore, the host for servers and industrial computers has a variety of electronic parts and components and peripheral expansion units mounted therein, such as motherboards, hard disk drivers, optical disk drives, various interface cards for expansion functions, and power supplies, and as a result, the host for servers and industrial computers generally has an excessive large volume. Although the host for servers and industrial computers is permitted to have a much larger size than the common personal computers to accommodate more electronic parts and components and peripheral expansion units, considering the manufacturing cost and space of the workshop, a series of general dimension specifications for host are issued in this field, for example, 1 U (unit=1.75 inches), 2 U, 3 U, and 4 U made depending upon the height of rackmounts. Therefore, how to efficiently allocate the positions of various electronic parts and components within a limited space of the host has become an important issue in this field.

As for the host for some servers or industrial computers, in order to ensure the electric energy to be continuously supplied to the host for a long time, a plurality of removable power supplies is disposed in the host, and thus preventing the servers or industrial computers from being interrupted during operations due to the failure of one power supply. The removable power supplies are electrically connected to a motherboard through a power supply interface card with a power supply unit (PSU). The removable power supplies are electrically connected to the power supply interface card, once they are inserted into the host.

Under the situation that electronic parts and components are allocated close to one another within the chassis of the host and the height of the chassis is rather limited, the motherboard with a large dimension plays an important role in arranging the space within the chassis. As a result, most of power supply interface cards have to be configured parallel to the motherboard. The electronic parts are all gathered and mounted on one side of the motherboard, so that the space on the other side of the motherboard is relatively flat. Therefore, in some servers or industrial computers, the power supply interface cards are often allocated under the motherboard (the side without electronic parts), and meanwhile, expansion slots for power supplies are disposed under the motherboard since the space under the motherboard is relatively flat. However, since other expansion units, such as an optical disk driver or a hard disk drive, are further disposed around the motherboard, the power supply interface cards are often blocked by the units around the motherboard when they are disposed under the motherboard. As a result, the power supply interface cards cannot be mounted and detached in a sufficient large space, which is really troublesome. Furthermore, as for some computers in specific models, the space within the host is really limited, and if the power supply interface card needs to be replaced, a new power supply interface card cannot be mounted and positioned unless the motherboard is detached first. As a result, the procedures for detaching and mounting the power supply interface card are rather time-consuming and labor-consuming.

SUMMARY OF THE INVENTION

In view of the above problem in the prior art that the interface cards cannot be mounted, detached, and replaced conveniently due to the limited space between a motherboard and peripheral units, the present invention is mainly directed to a chassis structure with an interface card bracket, which enables an interface card blocked by electronic parts and components in the host for a server or an industrial computer to be mounted and detached more conveniently.

In order to achieve the aforementioned object, the present invention provides a chassis structure with an interface card bracket, which includes a chassis and an interface card bracket. The chassis at least has a support member and a stopper disposed therein. The stopper may be an electronic part or component (such as a motherboard, an optical disk drive, a hard disk drive, or an interface card) mounted in the chassis or a partition board in the chassis. The support member and the stopper enclose an accommodation space within the chassis. The support member includes a guide portion inclined towards the stopper. The interface card bracket carries an interface card and includes an operating member and a carrying member. One end of the carrying member is pivoted to the operating member, and the interface card is fixed on the carrying member. When the interface card bracket moves towards the accommodation space, the carrying member and the operating member are pivoted with respect to each other and placed into the accommodation space upon being guided by the guide portion, thereby assembling the interface card into the accommodation space.

The efficacy of the present invention lies in that, the carrying member and the operating member of the interface card bracket are pivoted with respect to each other to change an included angle formed there-between. As such, the interface card bracket is not limited by the space enclosed by the stoppers any more, and the peripheral stoppers do not need to be detached. In addition, the guide portion of the support member may force the carrying member and the operating member to be automatically formed into an appropriate angle, and guide the carrying member to a predetermined assembling position. Thus, the procedures for mounting and detaching the interface card become more smooth and efficient.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

In order to make the object, structure, features, and functions of the present invention be more comprehensible, preferred embodiments are described in detail below with reference to the accompanying drawings.

Referring to FIGS. 1-13, a chassis structure with an interface card bracket according to a first embodiment of the present invention is shown, which includes a chassis 10 and an interface card bracket 20. The chassis structure provided by the present invention is applied in an electronic device allocated with an interface card, such as hosts of servers or industrial computers.

Referring to FIGS. 3, 4, 5, and 9, the chassis 10 includes a plurality of stoppers 11 disposed therein. The stoppers 11 may be (but not limited to) hard disk drives and enclosures thereof in a host of a computer. The chassis 10 further includes a stopper 12 disposed therein. The stopper 12 and the stoppers 11 are disposed opposite to each other, so that the space for an object to move within the chassis 10 is restricted by the stopper 12 and the stoppers 11. The stopper 12 may be (but not limited to) a motherboard in the case. The stoppers 11 and the stopper 12 may also be electronic parts and components (such as optical disk drivers and interface cards) mounted in the chassis 10 or partition boards in the chassis 10, and any member that restricts the inner space of the chassis 10 falls in the scope of the stoppers in the present invention.

In this embodiment, the chassis 10 further includes two support members 13 disposed therein, and each support member 13 is actually a folded plate with an I-shaped or L-shaped section. Each support member 13 is fixed within the chassis 10, and the stopper 12 is fixed on the support member 13. The support member 13 and the stopper 12 enclose an accommodation space 14 in the chassis 10. The stopper 12 is disposed at one side of the support member 13 and the accommodation space 14. In this way, an object to enter into the accommodation space 14 from the exterior is limited by a reserved space between the stoppers 11 and the stopper 12. Two pillars 16 are disposed in the accommodation space 14 of the chassis 10, and the bottom part of each pillar 16 is depressed inwards from the peripheries to form an annular slot 161. One or more pillars 16 may be existed, and the number of the pillars 16 does not influence the implementation of the present invention. The chassis 10 includes a partition board 18 disposed therein, which divides one end of the accommodation space 14 into two drawing trough 141. Each mobile rack 141 is connected into the chassis 10 from the exterior for accommodating an expansion unit 19, so as to assemble the expansion unit 19 in the chassis 10. The expansion unit 19 in the present invention is, for example, but not limited to, a removable power supply. The chassis 10 further includes a boss 17 disposed therein, which has a screw hole for fixing functions.

The support member 13 has a guide portion 151 and a limit portion 152 for connecting the guide portion 151. The limit portion 152 and the guide portion 151 form an included angle there-between. The guide portion 151 extends into the accommodation space 14 from the surface of the support member 13, and inclines towards the stopper 12. The limit portion 152 extends into the accommodation space 14 from the surface of the support member 13 and is substantially parallel to the stopper 12 and the chassis 10. Although two support members 13 are existed in the specific embodiment of the present invention, merely one support member 13 may also be used, and in this implementation aspect, one end of the stopper 12 is fixed on the support member 13, and the other end is fixed on the inner wall of the chassis 10.

Referring to FIGS. 1, 2, 3, and 8, the interface card bracket 20 carries an interface card 30, and includes an operating member 22, a carrying member 21, and a screwing member 223. The interface card bracket 20 is used to assemble the interface card 30 into the accommodation space 14, i.e., assemble the interface card 30 between the stopper 12 and the chassis 10. The interface card 30 has two electrical connection ports 31. For example, in the present invention, the interface card 30 is, for example, but not limited to, a power supply interface card matching with the expansion unit 19. One end of the carrying member 21 is pivoted to the operating member 22 via a stud shaft 23, so that the carrying member 21 and the operating member 22 may be flipped and pivoted with respect to each other. The interface card 30 is fixed on the carrying member 21. The operating member 22 includes a gripping portion 221 and two connecting portions 222. The gripping portion 221 is gripped by a user for pulling the carrying member 21 to move together. One end of each connecting portion 222 extends from the gripping portion 221, and the other end of the connecting portion 222 allows the stud shaft 23 to pass therethrough, so as to be pivoted to the carrying member 21. The other end edge of the carrying member 21 opposite to the operating member 22 includes at least one notch 211.

Figure 1:
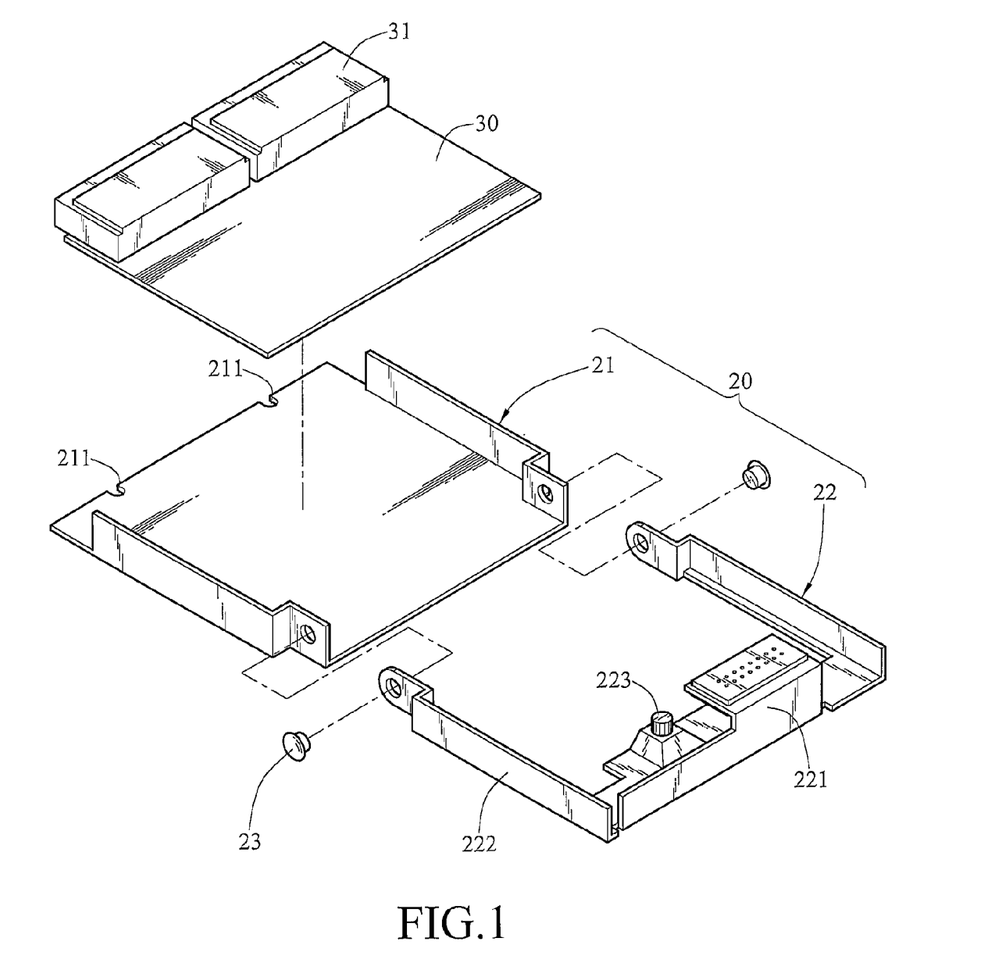
FIG. 1 is an exploded three-dimensional view of an interface card bracket according to a first embodiment of the present invention.
Figure 2:
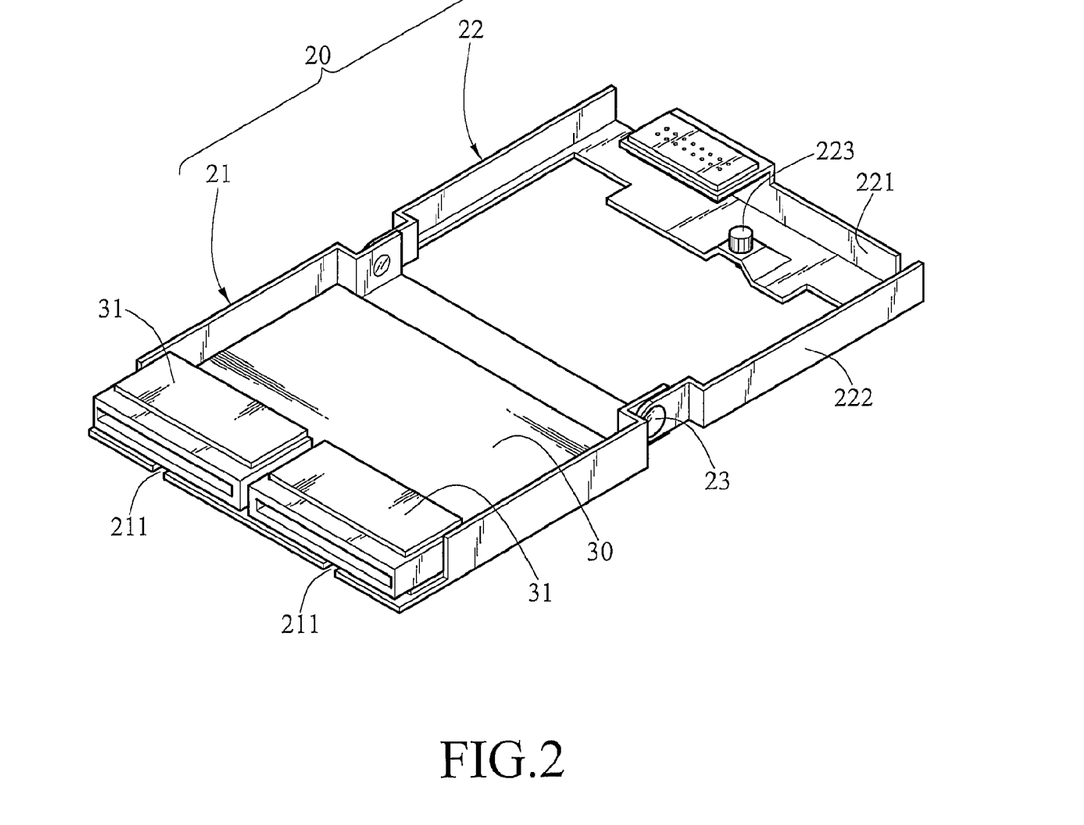
FIG. 2 is a schematic three-dimensional view of the interface card bracket according to the first embodiment of the present invention.
Figure 3:
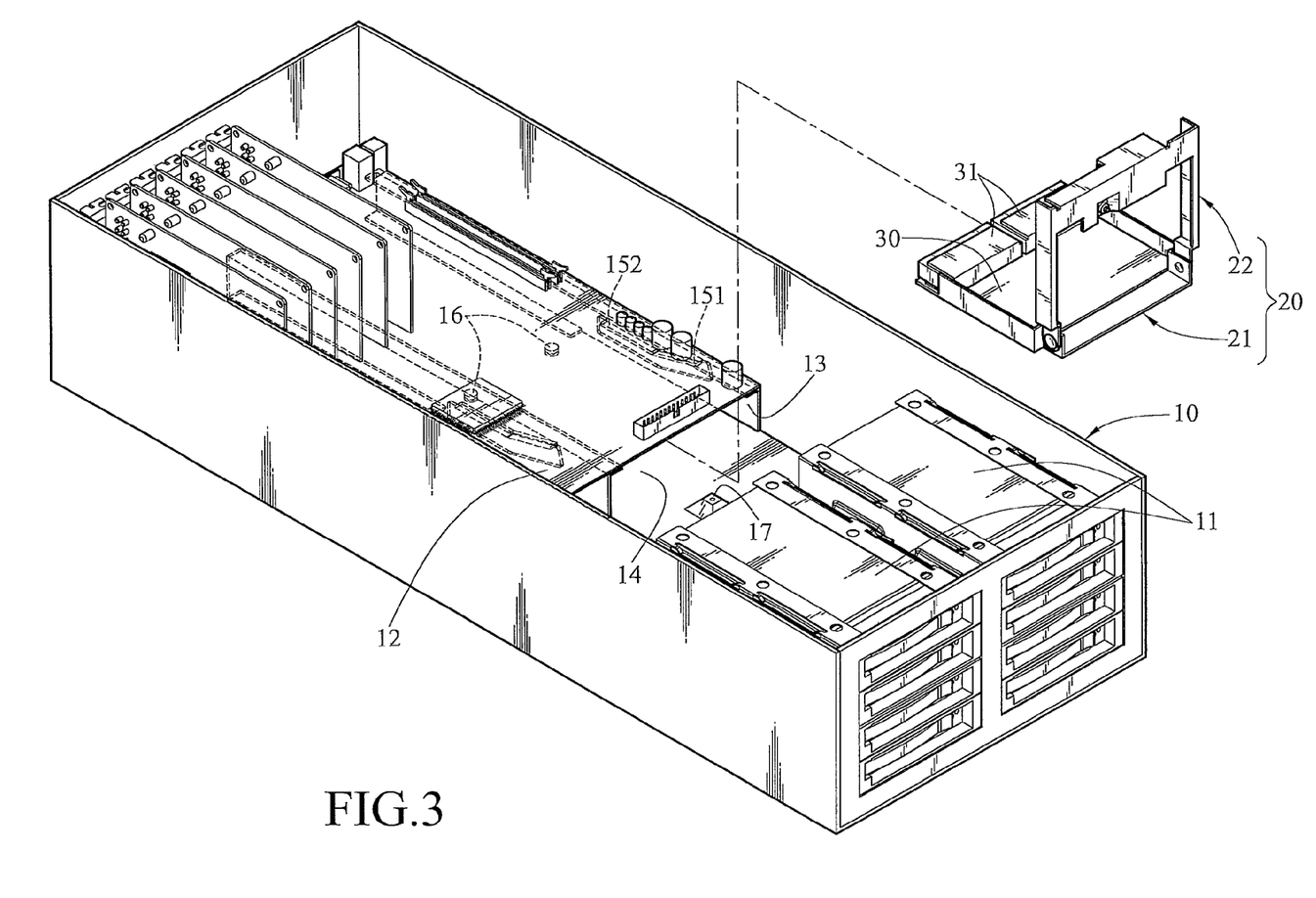
FIG. 3 is an exploded three-dimensional view of the interface card bracket and a chassis according to the first embodiment of the present invention.
Figure 4:
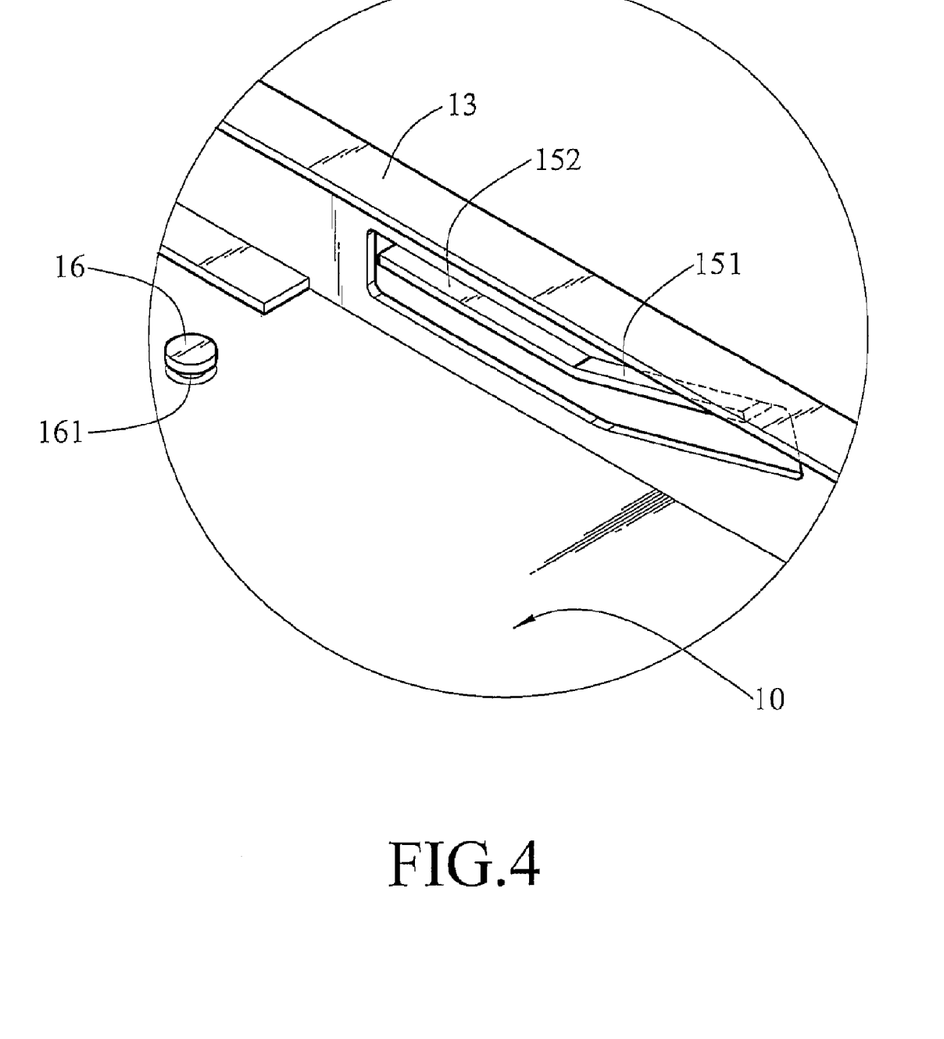
FIG. 4 is a partial schematic three-dimensional view of the chassis according to the first embodiment of the present invention.
Figure 5:
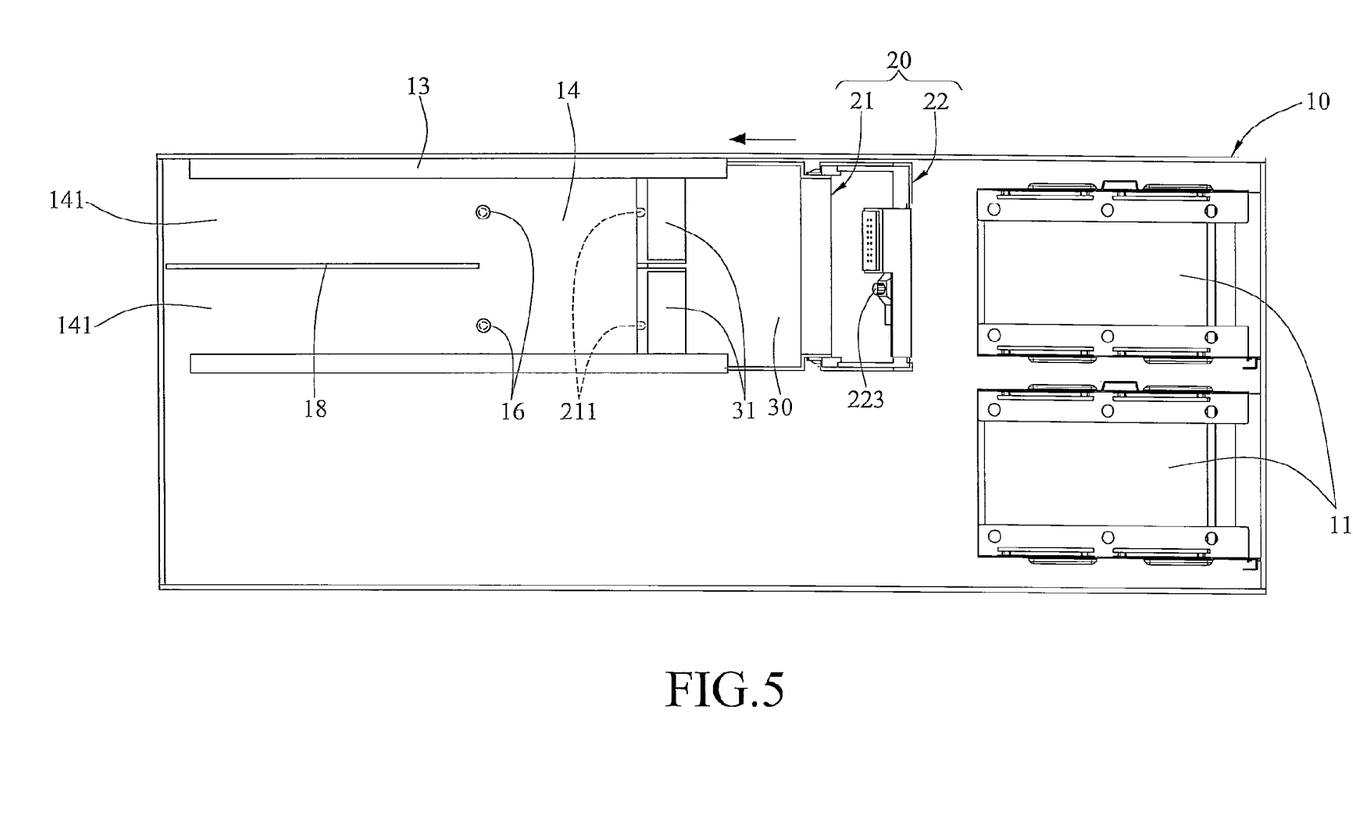
FIG. 5 is a top view of the chassis and the interface card bracket according to the first embodiment of the present invention.
Figure 6:
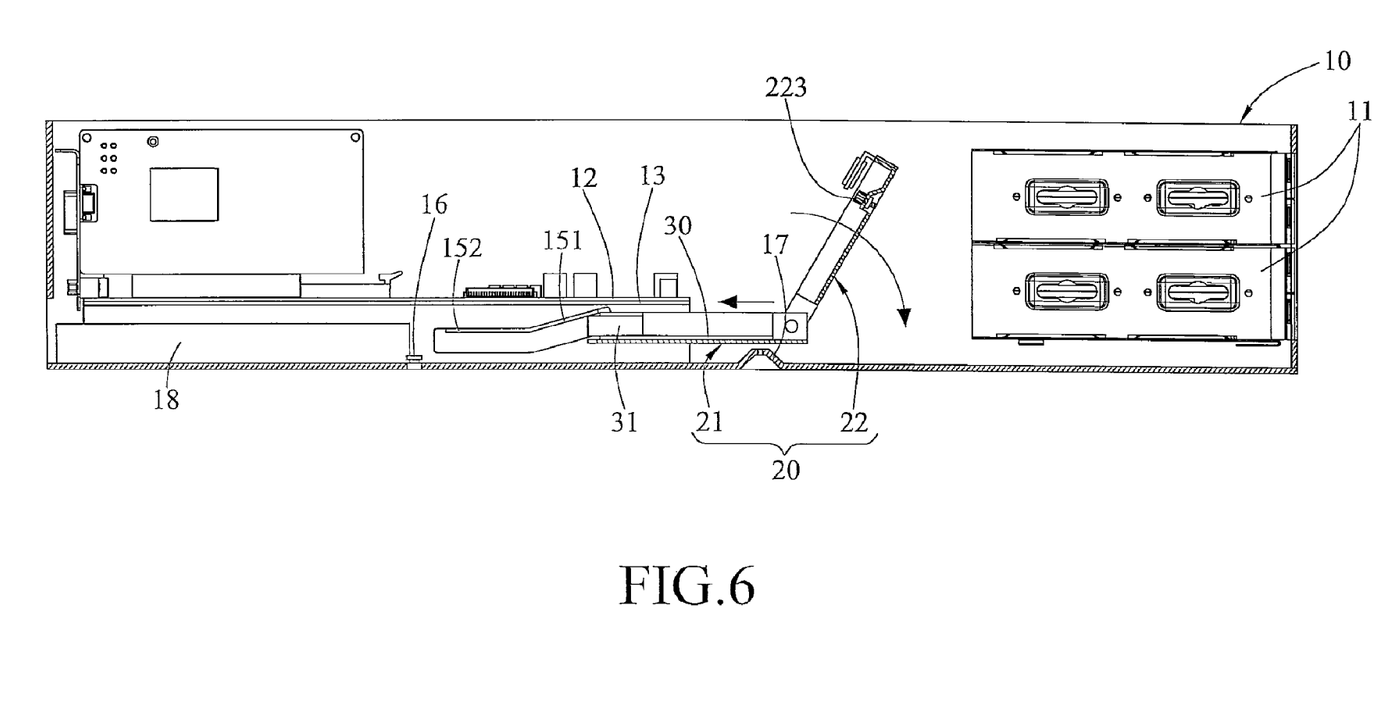
FIG. 6 is a side view of the chassis and the interface card bracket according to the first embodiment of the present invention.
Figure 7:
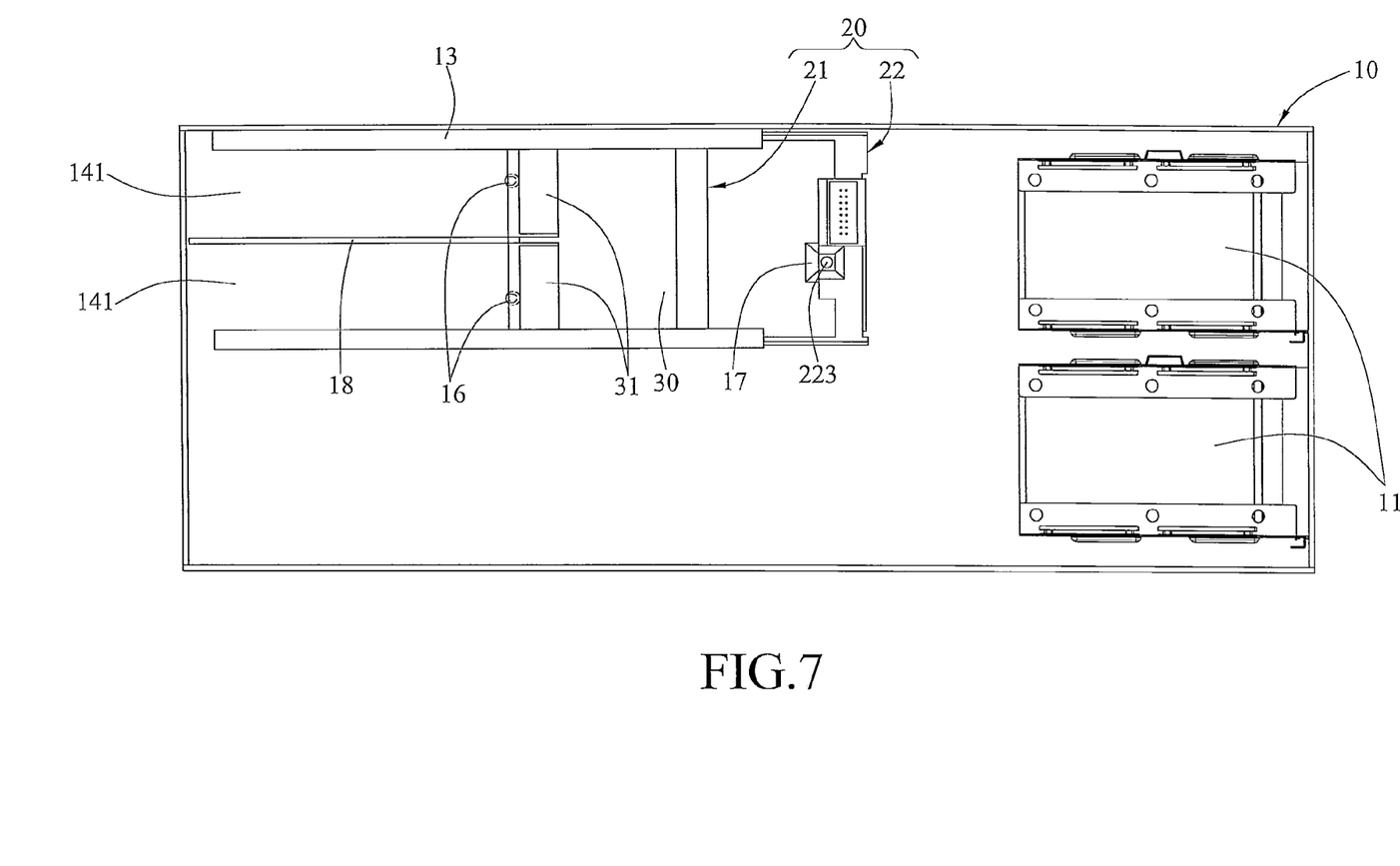
FIG. 7 is a top view of the chassis and the interface card bracket according to the first embodiment of the present invention.

Referring to FIGS. 3, 5, and 6, the interface card bracket 20 for carrying the interface card 30 moves towards the accommodation space 14 from the exterior of the chassis 10, and the interface card 30 passes between the stoppers 11 and the stopper 12. As the interface card bracket 20 moves towards the accommodation space 14, the carrying member 21 points towards the accommodation space 14. The carrying member 21 contacts with the guide portion 151 once entering into the accommodation space 14. Meanwhile, the carrying member 21 and the operating member 22 are pivoted with respect to each other upon being guided by the guide portion 151, so as to be formed into an appropriate angle and placed in the accommodation space 14, thereby assembling the interface card 30 into the accommodation space 14.

Figure 8:
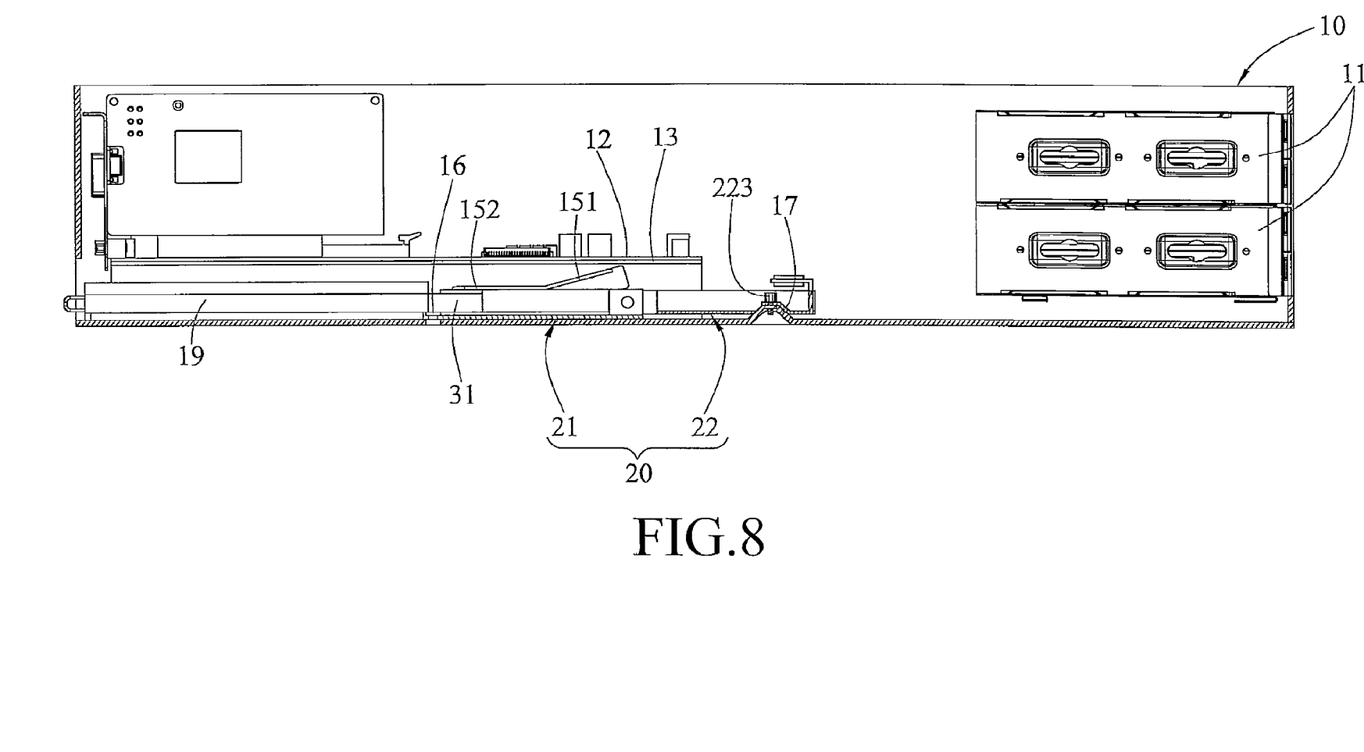
FIG. 8 is a side view of the chassis and the interface card bracket according to the first embodiment of the present invention.
Figure 9:
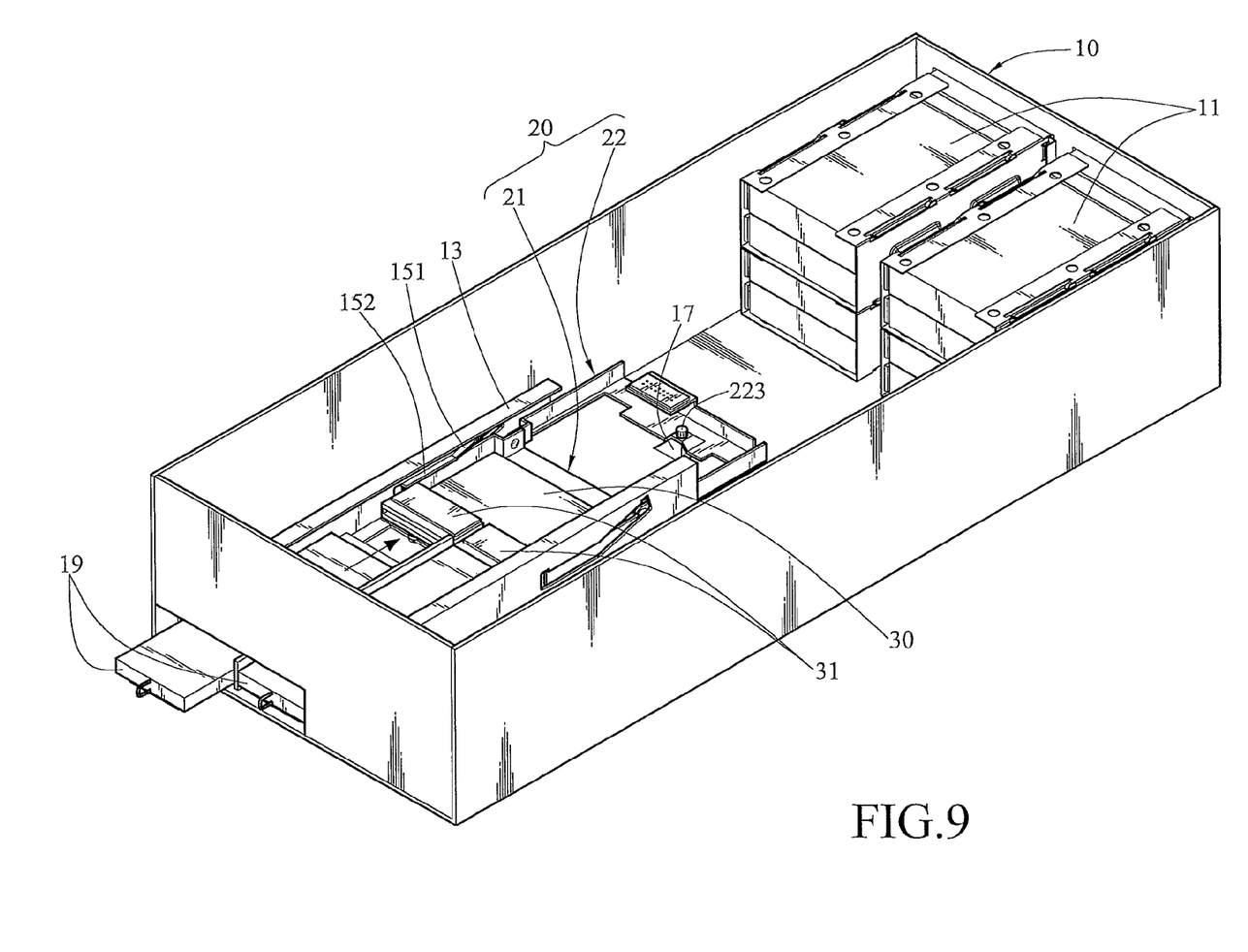
FIG. 9 is an exploded three-dimensional view of an expansion unit and the chassis according to the first embodiment of the present invention.
Figure 10:
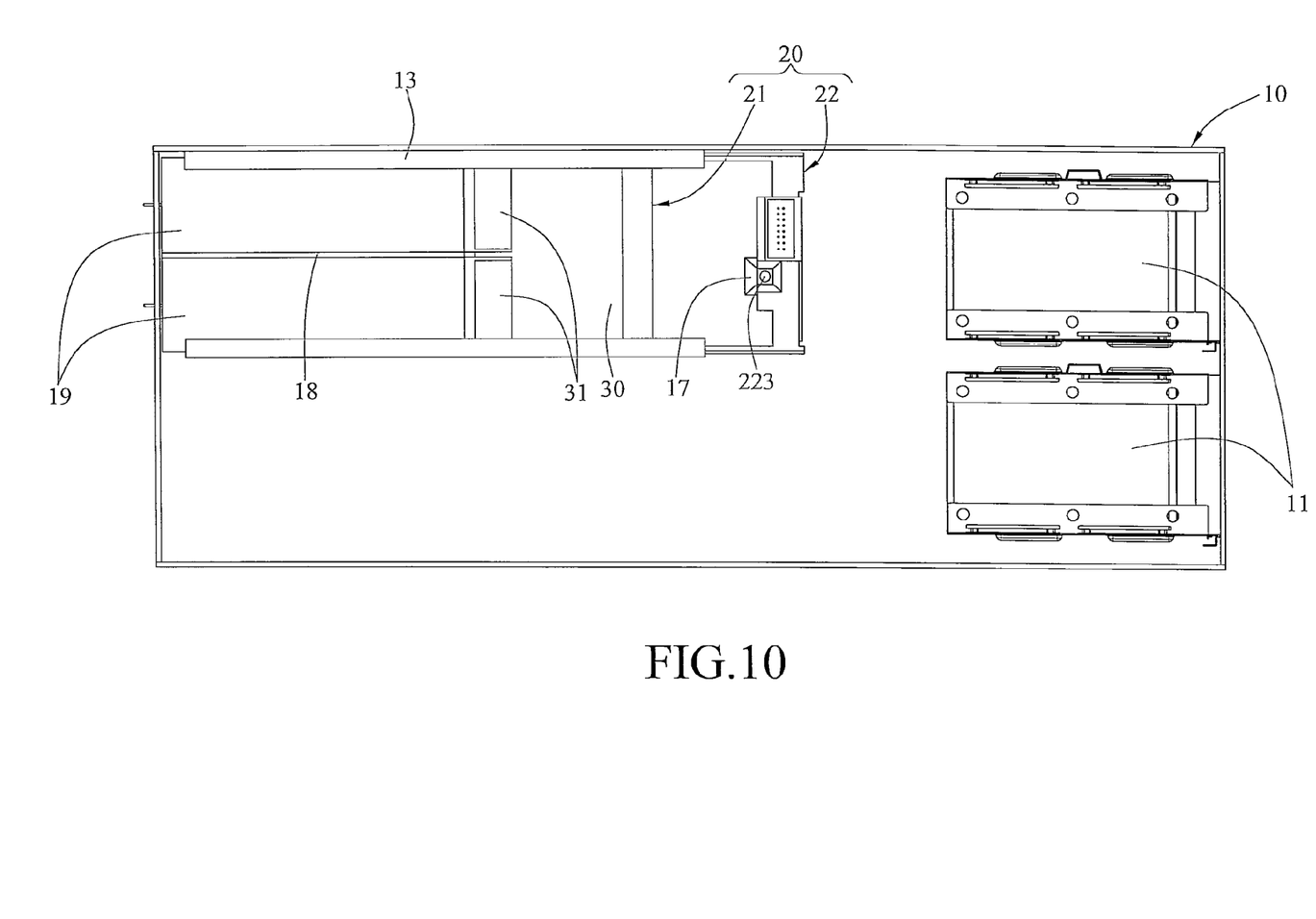
FIG. 10 is a top view of the chassis and the interface card bracket according to the first embodiment of the present invention.

Referring to FIGS. 6, 7, 8, 9, and 10, the interface card bracket 20 continues to move towards the accommodation space 14, and the carrying member 21 is paced between the limit portion 152 and the chassis 10 upon being guided by the guide portion 151. Then, the notch 211 of the support member 13 is engaged with the pillar 16 at an assembling position (as shown in FIG. 8) (the edge of the notch 211 is embedded in the annular slot 161 of the pillar 16), so as to limit the interface card bracket 20 at the assembling position. Finally, the screwing member 223 passes through the gripping portion 221 and is screwed into the screw hole of the boss 17 of the chassis 10, and the interface card bracket 20 and the interface card 30 are then fixed on the chassis 10. At this time, the electrical connection ports 31 of the interface card 30 are corresponding to each mobile rack 141 respectively, and the expansion unit 19 placed in the drawing trough 141 is electrically connected to the interface card 30, i.e., the electrical connection port of the expansion unit 19 is plugged and connected with the electrical connection port 31 of the interface card 30.

Figure 11:
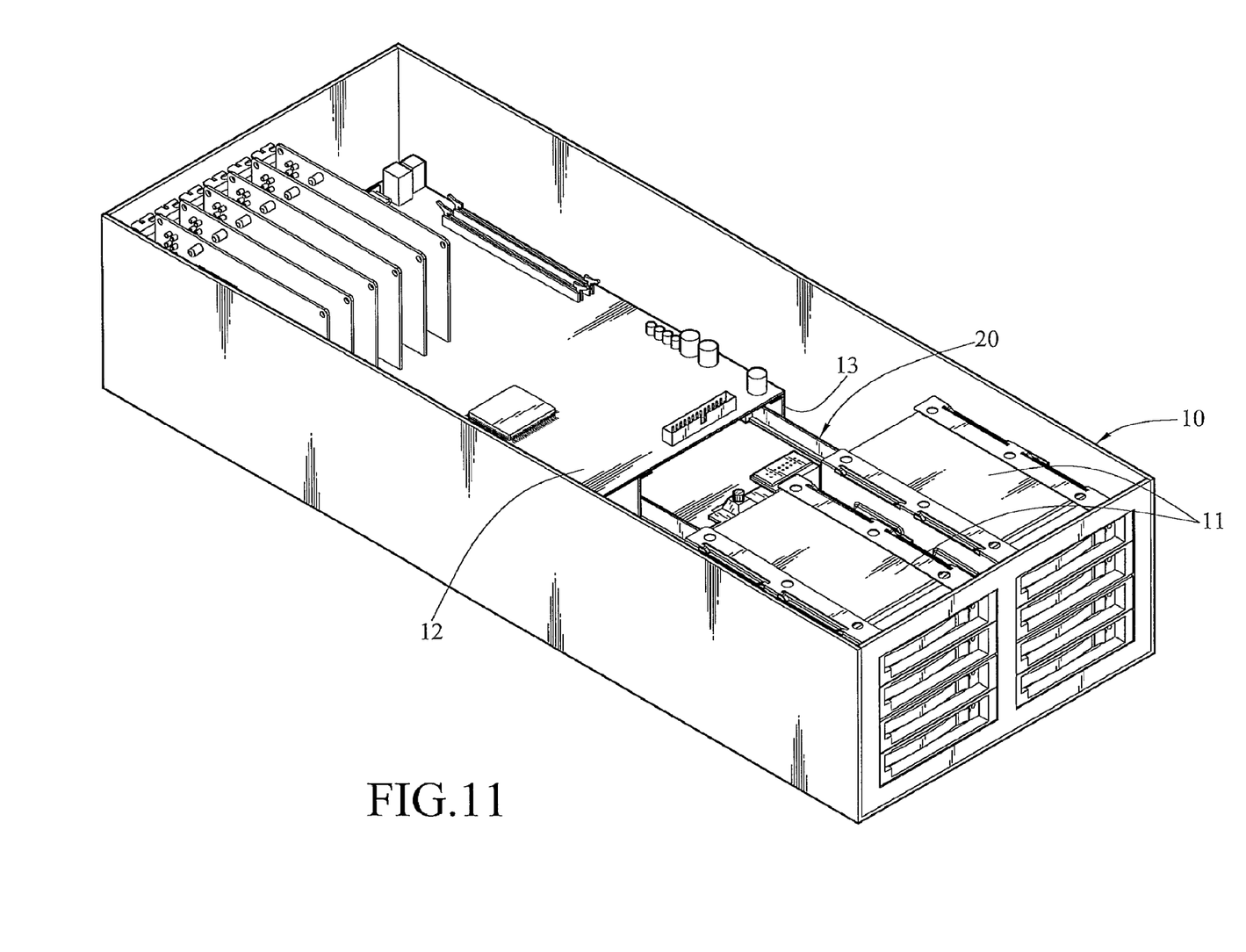
FIG. 11 is a schematic three-dimensional view of the interface card bracket assembled in the chassis according to the first embodiment of the present invention.
Figure 12:
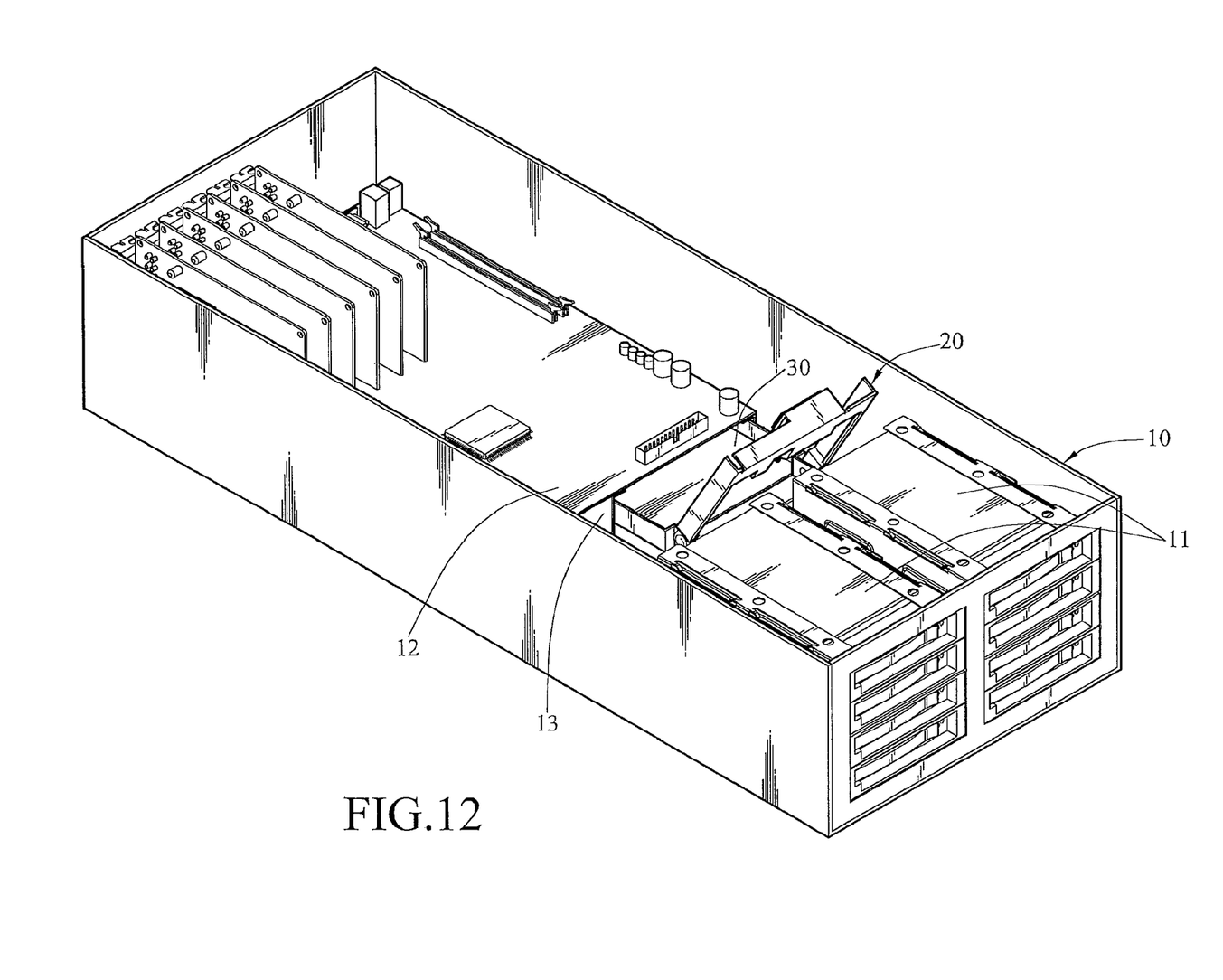
FIG. 12 is a schematic three-dimensional view of the interface card bracket detached from the chassis according to the first embodiment of the present invention.
Figure 13:
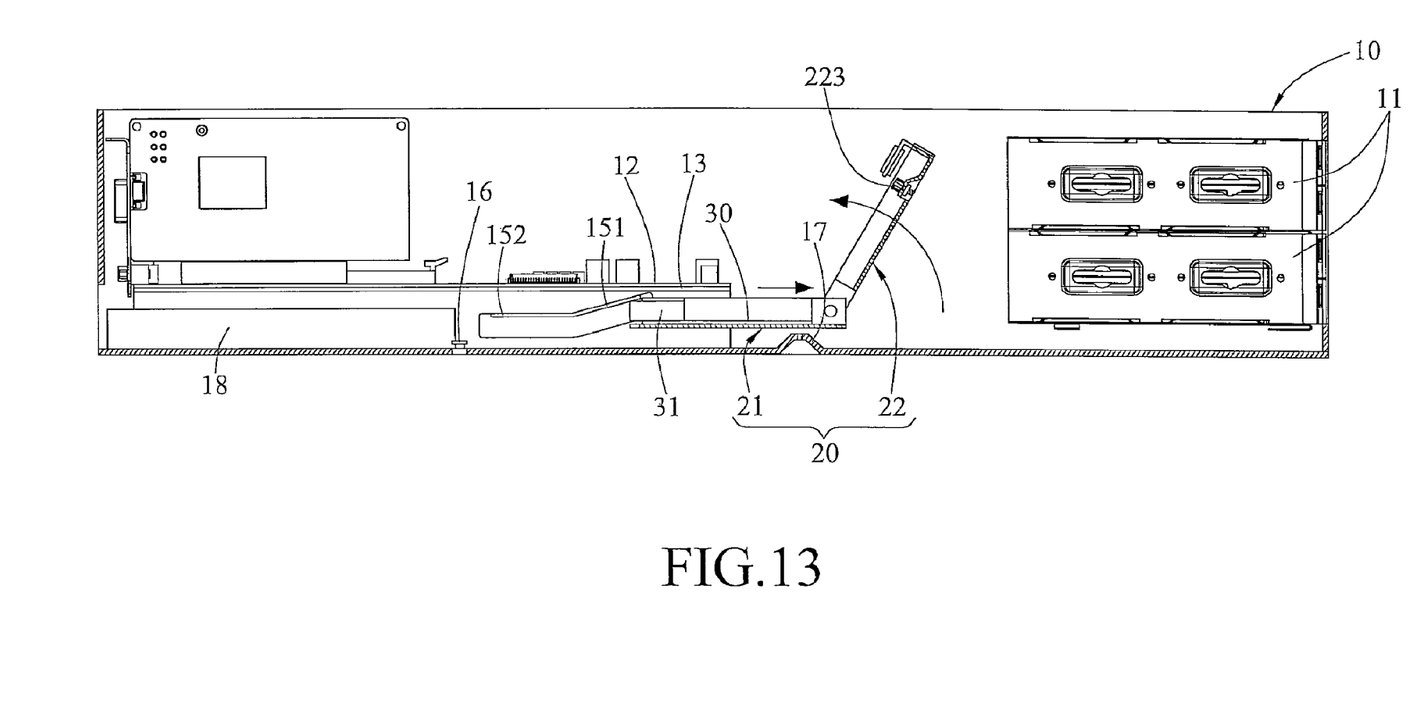
FIG. 13 is a side view of FIG. 12.

Referring to FIGS. 11, 12, and 13, once the screwing member 223 is detached, the operating member 22 is pulled to drive the interface card 30 to move outwards from the accommodation space 14. Meanwhile, as the interface card bracket 20 is moving outwards, the carrying member 21 and the operating member 22 are pivoted with respect to each other to form into an appropriate angle, so as to drive the carrying member 21 to be withdrawn out of the accommodation space 14, thereby detaching the interface card 30 and the interface card bracket 20 out of the accommodation space 14.

Figure 14:
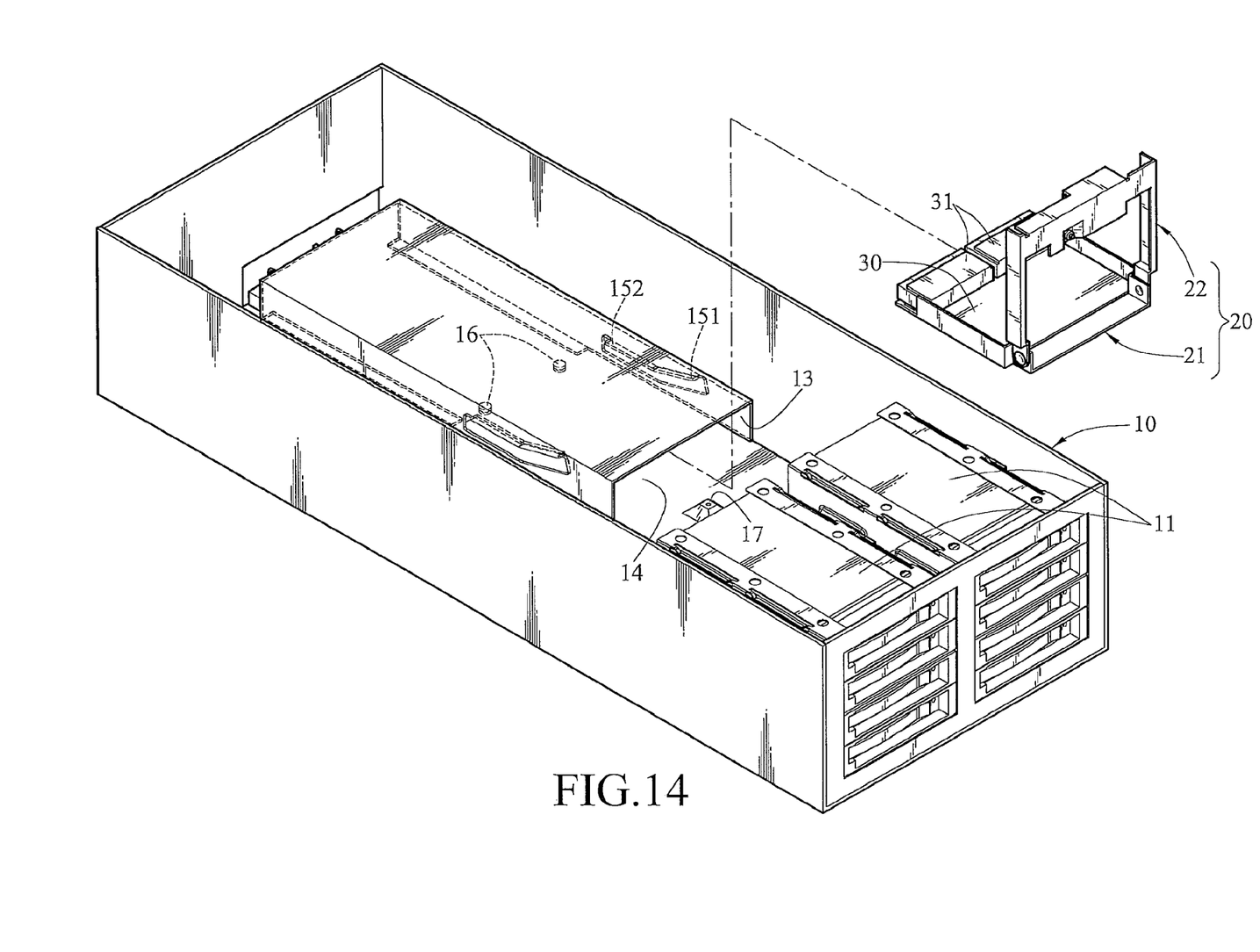
FIG. 14 is an exploded three-dimensional view of an interface card bracket and a chassis according to a second embodiment of the present invention.

Referring to FIG. 14, a second embodiment of the present invention is shown. This embodiment is substantially the same as the first embodiment in terms of the specific implementation aspect. The difference there-between lies in that only one support member 13 is disposed in the second embodiment, which has a specific configuration different from that in the first embodiment. The support member 13 is a folded plate having a ⌐-shaped section, which individually encloses an accommodation space 14 with a side wall of the chassis 10.

The carrying member and the operating member of the interface card bracket are pivoted with respect to each other to change an included angle formed there-between. As such, the interface card bracket is not limited by the space enclosed by the stoppers any more, and the peripheral stoppers do not need to be detached. In addition, the guide portion of the support member may force the carrying member and the operating member to be automatically formed into an appropriate angle, and guide the carrying member to a predetermined assembling position. Thus, the procedures for mounting and detaching the interface card become more smooth and efficient.

What is claimed is:

1. A chassis structure with an interface card bracket, comprising:
a chassis, having at least one support member disposed therein, wherein the support member and the chassis enclose an accommodation space, and the support member comprises at least one inclined guide portion; and
an interface card bracket, for carrying an interface card, wherein the interface card bracket comprises:
an operating member; and
a carrying member, with one end pivoted to the operating member, wherein the interface card is fixed on the carrying member; when the interface card bracket moves into the accommodation space, the carrying member and the operating member are pivoted with respect to each other and placed into the accommodation space upon being guided by the guide portion, thereby assembling the interface card into the accommodation space.

2. The chassis structure as claimed in claim 1, wherein the chassis further comprises at least one stopper disposed at one side of the accommodation space.

3. The chassis structure as claimed in claim 1, wherein when the operating member moves outwards from the accommodation space, the operating member pivoted with respect to the carrying member drives the carrying member to be withdrawn out of the accommodation space, thereby detaching the interface card out of the accommodation space.

4. The chassis structure as claimed in claim 1, wherein the support member further comprises a limit portion connecting the guide portion, the limit portion forms an included angle with the guide portion, and the carrying member is placed between the limit portion and the chassis upon being guided by the guide portion.

5. The chassis structure as claimed in claim 1, wherein the chassis is disposed with at least one pillar, and the carrying member further comprises at least one notch at the other end edge opposite to the operating member, and the notch is engaged with the pillar at an assembling position, so as to limit the interface card bracket at the assembling position.

6. The chassis structure as claimed in claim 1, wherein the operating member further comprises a gripping portion and two connecting portions, one end of each connecting portion extends out of the gripping portion, and the other end is pivoted to the carrying member.

7. The chassis structure as claimed in claim 6, wherein the interface card bracket further comprises a screwing member, and the screwing member passes through the gripping portion and is screwed into the chassis, so as to fix the interface card bracket on the chassis.

8. An interface card bracket, applied for carrying an interface card and assembling the interface card into an accommodation space of a chassis with a guide portion, the interface card bracket comprising:
an operating member, comprising a gripping portion and two connecting portions, one end of each connecting portion extending out of the gripping portion, and the other end being pivoted to the carrying member,
a carrying member, with one end pivoted to the operating member, wherein the interface card is fixed on the carrying member; when the carrying member and the operating member move into the accommodation space, the carrying member and the operating member are pivoted with respect to each other and placed in the accommodation space upon being guided by the guide portion, thereby assembling the interface card into the accommodation space; and
a screwing member, passing through the gripping portion and being screwed into the chassis, so as to fix the carrying member and the operating member on the chassis.

* * * * *